(12) United States Patent  (10) Patent No.: US 6,301,125 B1
Maeda  (45) Date of Patent: Oct. 9, 2001

(54) UNIT WITH SHIELD

(75) Inventor: Osamu Maeda, Daito (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 09/360,269

(22) Filed: Jul. 26, 1999

(30) Foreign Application Priority Data

Aug. 6, 1998 (JP) .................................................. 10-005964

(51) Int. Cl.[7] .................................................. H05K 9/00
(52) U.S. Cl. .................... 361/818; 174/35 R; 174/51 R; 439/943; 361/816
(58) Field of Search .................................... 361/818, 687, 361/684, 800, 816, 807, 799, 759; 174/35 R, 35 MS, 51 R

(56) References Cited

U.S. PATENT DOCUMENTS 5,353,201 * 10/1994 Maeda .................... 361/816
5,383,098 * 1/1995 Ma et al. .................... 361/818
5,946,199 * 8/1999 Matsuzaki .................... 361/181

* cited by examiner

*Primary Examiner*—Jeffrey Gaffin
*Assistant Examiner*—Hung S. bui
(74) *Attorney, Agent, or Firm*—Lackenbach Siegel Marzullo Aronson & Greenspan, P.C.

(57) ABSTRACT

A unit with shield includes a sub-circuit board (20). This sub-circuit board (20) is covered by a first shield plate (12) and second shield plate (14) engaged with each other through the sub-circuit board (20), and inserted in a hole (24) formed in a main circuit board (22). At this time, a first spring (36a) and second spring (36b), formed in an insertion (34) of the first shield plate (12), urges the sub-circuit board 20 against one surface of the hole (24), thereby fixing the sub-circuit board 20 in the hole (24). Also, the main circuit board (22) is clamped by an abutment portion (20a) formed in the sub-circuit board 20 and a removal preventing portion (38) formed in the first shield plate (12).

10 Claims, 3 Drawing Sheets

UNIT WITH SHIELD

BACKGROUND OF THE INVENTION

1. Field of the Invention

This invention relates to a unit with shield, and more particularly to a unit with shield having a shield plate covering a sub-circuit board to be inserted and mounted in a hole formed in a main circuit board.

2. Description of the Prior Art

Prior art of this kind is disclosed in a publication of Japanese Utility Model Laying-open No. 77400/1988 laid open to the public on May 23, 1988. This prior art is provided with terminals as mounting legs on a sub-circuit board covered by a shield plate in order to enable the sub-circuit board to be mounted onto a main circuit board.

In the prior art, however, there has been a problem of process complication in providing terminals on a sub-circuit board, resulting in an increase in manufacturing costs.

SUMMARY OF THE INVENTION

Therefore, it is a primary object of the present invention to provide a unit with a shield which is simple in structure but capable of inserting and fixing a sub-circuit board in a hole formed in a main circuit board.

A unit with shield according to the present invention has: a shield plate covering over a sub-circuit board to be inserted into a hole formed in a main circuit board; a first shield plate and a second shield plate which are engaged through the sub-circuit board to cover over respective main surfaces of the sub-circuit board; and a spring portion provided in a lower portion of the first shied plate and inserted into the hole.

As for main and back surface sides of the sub-circuit board, the first shield plate and the second shield plate are inserted in a hole formed in the lower portion of the main circuit board. Accordingly, the sub-circuit board is covered over and hence shielded by the first shield plate and second shield plate which are engaged with each other through the sub-circuit board.

According to the present invention, the sub-circuit board and the first and second shield plates (unit with shield) can be positively fixed on the main circuit board by merely inserting the spring portion in the hole formed in the main circuit board. Consequently, structure is simplified and cost is reduced as compared to the conventional.

The above spring portion includes a first spring and a second spring provided on respective surfaces of the lower portion of the first shield plate. Due to this, the spring portion provided in the lower portion of the first shield plate is inserted in the hole of the main circuit board, whereby the unit with shield, i.e. the sub-substrate and the first and second shield plates, is fixed on the main circuit board.

In one aspect of the present invention, the spring portion urges the sub-circuit board against one surface of the hole whereby a pattern formed on the sub-circuit board and a pattern formed on a backside of the main circuit board are brought into close contact with each other. It is therefore possible to positively solder between the patterns by dipping.

In another aspect of the present invention, because a removal preventing portion is provided in the lower portion of the first shield plate, the sub-circuit board, first shield plate and second shield plate are prevented from being removed from the main circuit The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
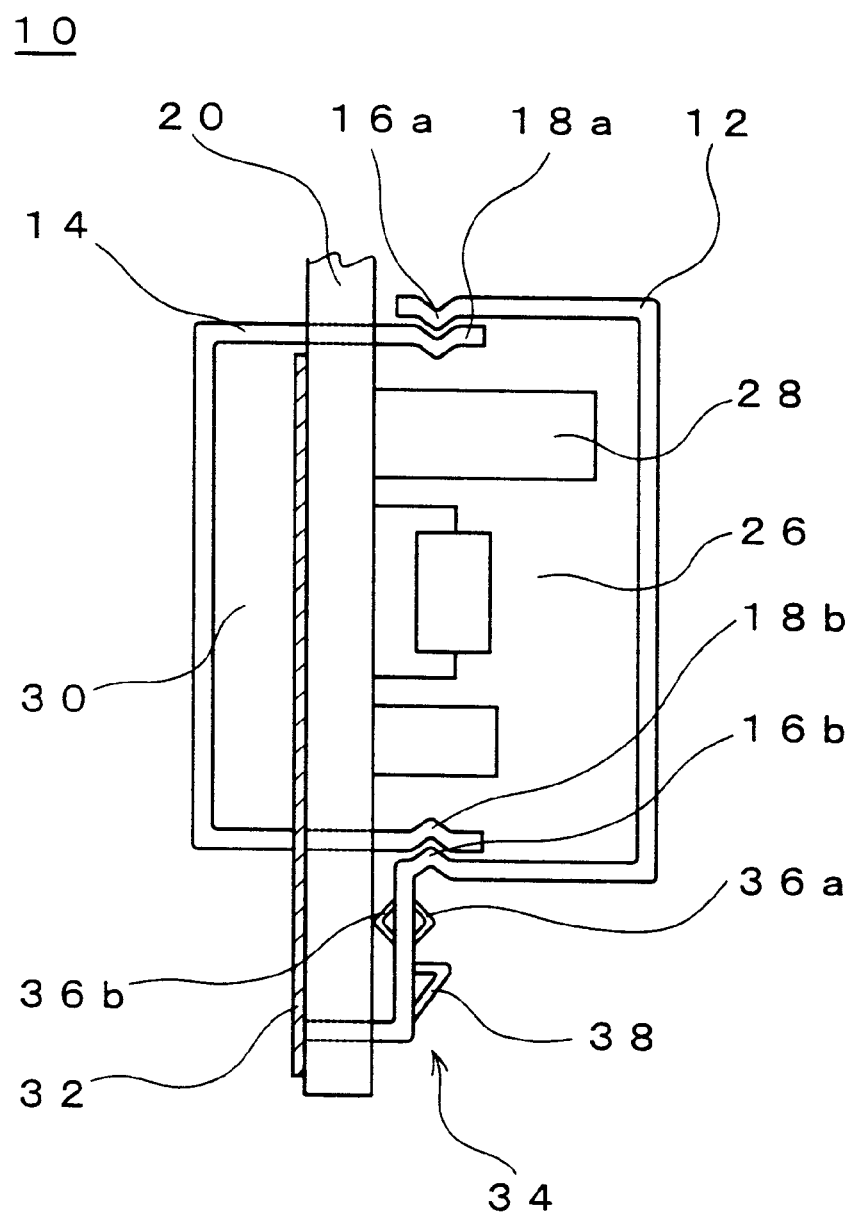
FIG. 1 is an illustrative view showing one embodiment of the present invention.

A unit with shield 10 shown in FIG. 1 includes a first shield plate 12 and a second shield plate 14 that are formed of a conductive material, for example, a metal. The first shield plate 12 and the second shield plate 14 are engaged with each other through a sub-circuit board 20, by engagements of engaging portions 16a and 16b of the first shield plate 12 with the engaging portions 18a and 18b of the second shield plate 14, thereby covering the sub-circuit board 20.

That is, the first shield plate 12 and the second shield plate 14 are each made as a metal case having a bottom and an opposing opening. The opening of the second shield plate 14 is closed by the first shield plate 12 whereby two main surfaces of the sub-circuit board 20 are provided with shields. The sub-circuit board 20 covered with the first shield plate 12 and second shield plate 14 (FIG. 1) is inserted in a hole 24 formed in a main circuit board 22, as shown in FIG. 2.

Referring further to FIG. 1, the sub-circuit board 20 has one main surface (parts side) 26 mounted with appropriate parts 28. The parts side 26 is covered over by the first shield plate 12. Also, the other main surface (pattern side) 30 is formed with a pattern 32 in an appropriate form. The pattern side 30 is covered by the second shield plate 14 in areas except for a lower portion thereof. That is, the lower portion of the pattern side 30 is not shielded but exposed outside.

The first shield plate 12 has an insertion portion 34 extending down from the engaging portion 16b. The insertion portion 34 has a first spring 36a and a second spring 36b formed by metal coining to form ribs that project on opposite sides from the insertion portion 34. A removal preventing portion 38 is further formed underneath the first and second springs 36 by coining. The removal preventing portion 38 projects toward the front of the insertion portion 34, that is, in the same direction of the first spring 36a.

Figure 2:
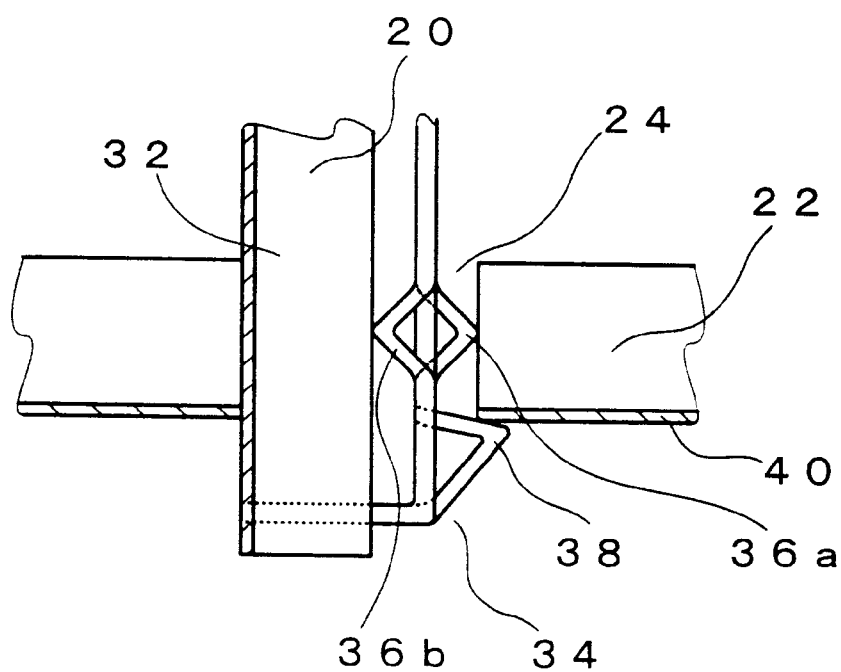
FIG. 2 is an illustrative view showing a state that a unit with a shield is inserted in holes of a main circuit board in the FIG. 1 embodiment.

The first spring 36a is bent in a bow form in a direction toward an inner periphery of the hole 24, as will be well understood from FIG. 2. When the unit with shield 10 is inserted into the hole 24, the first spring 36a comes into abutment against the inner periphery of the hole 24. Meanwhile, the second spring 36b is bent in a direction toward the parts side 26, and abuts against the parts side 26 at its lower portion.

The removal preventing portion 38 projects toward a front of one main surface of the insertion portion 34, i.e. toward inner periphery of the hole 24. The removal preventing portion 38 at its top end abuts against a backside of the main circuit board 22 whereby the unit with shield 10 is prevented from being removed out of the hole 24.

Figure 3:
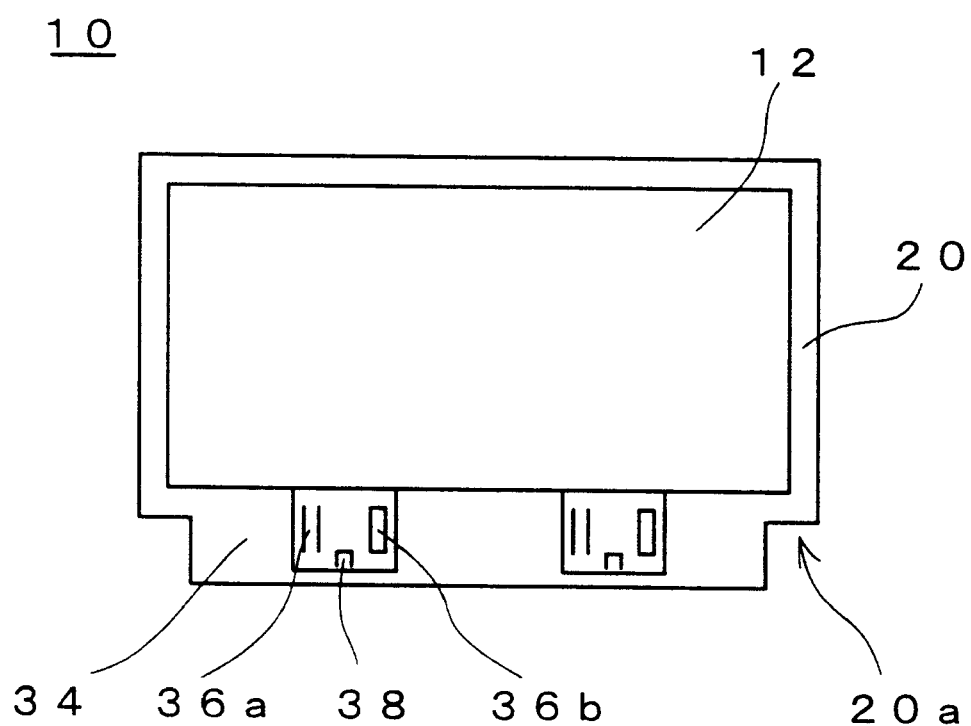
FIG. 3 is a front view of the FIG. 1 embodiment.

As will be well understood from FIG. 3, the insertion portion 34 is provided lower left and right in the first plate 12. Each of the insertion portions 34 has a first spring 36a and second spring 36b arranged horizontally parallel with each other while a removal preventing portion 38 is formed intermediate between the first spring 36a and the second spring 36b. Furthermore, steps are formed in the lower portion of the sub-circuit board 20. These steps respectively provides abutment portions 20a. These abutment portions 20a are to be abutted against a top surface of the main circuit board 22.

If the unit with shield is inserted into the hole 24 formed in the main circuit board 22, the first spring 36a of the insertion portion 34 comes into contact with one inner periphery of the hole 24 to have a force. This force is to be applied to the pattern side 30 of the sub-circuit board 20 through the second spring 36b. That is, the unit with shield 10 is fixed in the hole 24 due to a force of the first spring 36a that urges the pattern side 30 against the other inner periphery of the hole 24.

By urging pattern side 30 against the inner periphery of the hole 24, the first pattern 32 formed on the pattern side 30 and the second pattern 40 formed on the backside of the main circuit board 20 are brought into close contact with each other. Accordingly, the first pattern 32 and the second pattern 40 are positively soldered during dipping without causing deviation in their positions.

Furthermore, the sub-circuit board is vertically positioned in position by abutting the abutting portion 20a of the sub-circuit board 20 against the top surface of the main circuit board 22 as well as abutting the removal preventing portion 38 against the underside of the main circuit board 22.

Incidentally, the first spring 36a and the second spring 36b can be modified into various forms, such as a trapezoidal form and a clip form, besides the triangular form shown. These springs, if formed in a trapezoidal form, will increase an abutment area against the inner surface of the hole 24, providing closer contact of the sub-circuit board 20 with the main circuit board 22.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A unit with shield for covering a sub-circuit board to be inserted into a hole formed in a main circuit board having a top surface and an opposing pattern side, comprising:
    a first shield plate and a second shield plate which are engaged with each other by at least one of said shield plates extending through said sub-circuit board to cover over respective main surfaces of said sub-circuit board; and
    a spring portion provided in a lower portion of said first shield plate and inserted into said hole, whereby when said sub-circuit board is inserted into said hole of said main circuit board, said spring portion urges said sub-circuit board against an inner surface of said hole.

2. A unit with shield according to claim 1, wherein said lower portion of said first shield plate is positioned on a side of one main surface of said sub-circuit board,
    said spring portion including first and second springs oppositely projecting from respective surfaces of said lower portion.

3. A unit with shield according to claim 2, wherein said first spring and said second spring are formed by metal coining to form ribs that project from said lower portion.

4. A unit with a shield according to claim 1, wherein said sub-circuit board includes an abutment portion to be abutted against a top surface of said main circuit board.

5. A unit with a shield according to claim 2, wherein said sub-circuit board includes an abutment portion to be abutted against a top surface of said main circuit board.

6. A unit with a shield according to claim 3, wherein said sub-circuit board includes an abutment portion to be abutted against a top surface of said main circuit board.

7. A unit with shield according to claim 1, further comprising removal preventing portion formed in said lower portion of said first shield plate.

8. A unit with shield according to claim 2, further comprising removal preventing portion formed in said lower portion of said first shield plate.

9. A unit with shield according to claim 3, further comprising removal preventing portion formed in said lower portion of said first shield plate.

10. A unit according to claim 1, wherein said sub-circuit board has a pattern side surface on which a circuit pattern is formed in a lower portion of said sub-circuit board to be exposed from the first and second shield plates, said pattern being connected to a pattern formed on a bottom surface of said main circuit board.

\* \* \* \* \*